(12) United States Patent
Zhang et al.

(10) Patent No.: US 8,289,661 B2
(45) Date of Patent: Oct. 16, 2012

(54) CPP STRUCTURE WITH ENHANCED GMR RATIO

(75) Inventors: Kunliang Zhang, Milpitas, CA (US); Min Li, Dublin, CA (US); Yu-Hsia Chen, Mountain View, CA (US); Chyu-Jiuh Torng, Pleasanton, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 13/065,975

(22) Filed: Apr. 4, 2011

(65) Prior Publication Data
US 2011/0183158 A1 Jul. 28, 2011

Related U.S. Application Data

(62) Division of application No. 11/180,808, filed on Jul. 13, 2005, now Pat. No. 7,918,014.

(51) Int. Cl.
*G11B 5/127* (2006.01)

(52) U.S. Cl. .................................. 360/324.12

(58) Field of Classification Search ............. 360/324.2, 360/324.11, 324.12; 29/603.03, 603.04, 29/603.12, 603.16
See application file for complete search history.

(56) References Cited

U.S. PATENT DOCUMENTS

| | | | |
|---|---|---|---|
| 5,627,704 A | 5/1997 | Lederman et al. |
| 5,668,688 A | 9/1997 | Dykes et al. |
| 5,715,121 A | 2/1998 | Sakakima et al. |
| 6,301,089 B1 | 10/2001 | Saito et al. |
| 6,338,899 B1 | 1/2002 | Fukuzawa et al. |
| 6,434,814 B1 | 8/2002 | Chang et al. |
| 6,473,278 B1 | 10/2002 | Gill |
| 6,519,124 B1 | 2/2003 | Redon et al. |
| 6,529,353 B2 | 3/2003 | Shimazawa |
| 6,592,725 B2 | 7/2003 | Lin et al. |

(Continued)

FOREIGN PATENT DOCUMENTS

JP 2002-208120 7/2002

(Continued)

OTHER PUBLICATIONS

"The scalability of CPP-GMR heads toward over 100Gbpsi, compared with TMR heads," by M. Takagishi et al., Corporate R&D Center, Toshiba Corp., TMRC2001, Aug. 20, 2001, 10 pgs.

(Continued)

*Primary Examiner* — Allen Cao
(74) *Attorney, Agent, or Firm* — Saile Ackerman LLC; Stephen B. Ackerman

(57) ABSTRACT

A CPP-GMR spin valve having a CoFe/NiFe composite free layer is disclosed in which Fe content of the CoFe layer ranges from 20 to 70 atomic % and Ni content in the NiFe layer varies from 85 to 100 atomic % to maintain low Hc and $\lambda_S$ values. A higher than normal Fe content in the CoFe layer improves the MR ratio by $\geq 16\%$ compared with conventional CoFe/NiFe free layers in which the Fe content in CoFe is typically <20 atomic % and the Ni content in NiFe is <85 atomic %. The CPP-GMR performance may also be optimized by incorporating a confining current path layer in the copper spacer between the pinned layer and free layer. For a pinned layer with an AP2/Ru/AP1 configuration, the spin valve performance is further improved by an AP1 layer comprised of a lamination of CoFe and Cu layers as in [CoFe/Cu]$_2$/CoFe.

20 Claims, 1 Drawing Sheet

U.S. PATENT DOCUMENTS

| | | |
|---|---|---|
| 6,754,056 B2 | 6/2004 | Ho et al. |
| 6,778,427 B2 | 8/2004 | Odagawa et al. |
| 6,888,707 B2 | 5/2005 | Horng et al. |
| 6,982,932 B2 * | 1/2006 | Sakakima et al. ......... 369/13.17 |
| 7,256,971 B2 | 8/2007 | Horng et al. |
| 7,323,215 B2 | 1/2008 | Li et al. |
| 7,331,100 B2 | 2/2008 | Li et al. |
| 7,390,529 B2 | 6/2008 | Li et al. |
| 7,390,530 B2 | 6/2008 | Wang et al. |
| 7,602,590 B2 | 10/2009 | Zhao et al. |
| 7,742,261 B2 | 6/2010 | Zhao et al. |
| 8,059,374 B2 * | 11/2011 | Zhao et al. ................ 360/324.2 |
| 2007/0242396 A1 * | 10/2007 | Shimazawa et al. ..... 360/324.12 |
| 2008/0278864 A1 * | 11/2008 | Zhang et al. ............. 360/324.12 |
| 2010/0177449 A1 * | 7/2010 | Zhao et al. ............... 360/324.12 |
| 2012/0009337 A1 * | 1/2012 | Zhang et al. .................. 427/131 |

FOREIGN PATENT DOCUMENTS

| | | |
|---|---|---|
| JP | 2003-101098 | 4/2003 |
| JP | 2006-135253 | 5/2006 |

OTHER PUBLICATIONS

Japanese Office Action—No. 2006-191899 Mail date—Aug. 23, 2011, Headway Technologies Inc.

* cited by examiner

CPP STRUCTURE WITH ENHANCED GMR RATIO

This is a Divisional application of U.S. patent application Ser. No. 11/180,808, filed on Jul. 13, 2005, now U.S. Pat. No. 7,918,014, which is herein incorporated by reference in its entirety, and assigned to a common assignee.

RELATED PATENT APPLICATIONS

This application is related to the following: U.S. Pat. No. 7,256,971; and U.S. Pat. No. 7,331,100; both assigned to a common assignee.

FIELD OF THE INVENTION

The invention relates to an improved free layer for use in a giant magnetoresistive (GMR) sensor in a current perpendicular to plane (CPP) magnetic read head and in particular to a composite free layer that improves the magnetoresistance (MR) ratio while exhibiting low coercivity and negligible magnetostriction.

BACKGROUND OF THE INVENTION

A magnetic disk drive includes circular data tracks on a rotating magnetic disk and read and write heads that may form a merged head attached to a slider on a positioning arm. During a read or write operation, the merged head is suspended over the magnetic disk on an air bearing surface (ABS). The sensor in a read head is a critical component since it is used to detect magnetic field signals by a resistance change. There is a magnetoresistance effect produced by spin valve magnetoresistance (SVMR) or giant magnetoresistance (GMR) which is based on a configuration in which two ferromagnetic layers are separated by a non-magnetic conductive layer in the sensor stack. One of the ferromagnetic layers is a pinned layer in which the magnetization direction is fixed by exchange coupling with an adjacent anti-ferromagnetic (AFM) or pinning layer. The second ferromagnetic layer is a free layer in which the magnetization vector can rotate in response to external magnetic fields. The rotation of magnetization in the free layer relative to the fixed layer magnetization generates a resistance change that is detected as a voltage change when a sense current is passed through the structure. In a CPP configuration, a sense current is passed through the sensor in a direction perpendicular to the layers in the stack. Alternatively, there is a current-in-plane (CIP) configuration where the sense current passes through the sensor in a direction parallel to the planes of the layers in the sensor stack.

Ultra-high density (over 100 Gb/in$^2$) recording requires a highly sensitive read head. To meet this requirement, the CPP configuration is a stronger candidate than the CIP configuration which has been used in recent hard disk drives (HDDs). The CPP configuration is more desirable for ultra-high density applications because a stronger output signal is achieved as the sensor size decreases, and the MR ratio is higher for a CPP configuration. Furthermore, in U.S. Pat. No. 5,627,704, a GMR-CPP transducer is described that has a plurality of GMR structures which are connected serially to provide a larger output signal than can be obtained with a single GMR stack.

In the CPP GMR head structure, a bottom synthetic spin valve film stack is generally employed for biasing reasons as opposed to a top spin valve where the free layer is below the spacer and the pinned layer is above the copper spacer. Additionally, a CoFe/NiFe composite free layer is conventionally used following the tradition of CIP GMR improvements. An important characteristic of a GMR head is the MR ratio which is dR/R where dR is the change in resistance of the spin valve sensor and R is the resistance of the spin valve sensor before the change. A higher MR ratio is desired for improved sensitivity in the device and this result is achieved when electrons in the sense current spend more time within the magnetically active layers of the sensor. Interfacial scattering which is the specular reflection of electrons at the interfaces between layers in the sensor stack can improve the MR ratio and increase sensitivity.

Toshiba has shown (Ref. 3) that for a synthetic anti-parallel (SyAP) pinned layer configuration, laminating the CoFe AP1 layers with thin Cu layers can improve the MR ratio in CPP GMR heads. The resulting CPP-GMR bottom spin valve is represented by seed/AFM/pinned/spacer/free/cap where seed is a seed layer, the spacer is a copper layer, the free layer is a CoFe/NiFe composite, and the pinned layer has an [AP2/coupling/AP1] SyAP configuration in which Ru is the coupling layer and the AP1 layer is a [CoFe_Cu] laminated layer.

U.S. Pat. No. 5,715,121 discloses a further means of CPP-GMR improvement by inserting a confining current path (CCP) layer in the copper spacer by segregating metal path and oxide formation. Moreover, a soft magnetic film (free layer) is described that is Ni-rich and includes Co such as $Ni_{0.80}Co_{0.15}Fe_{0.05}$ and $Ni_{0.68}Co_{0.20}Fe_{0.12}$ or has a high Co content as in $Co_{0.9}Fe_{0.1}$ and $Co_{0.7}Ni_{0.1}Fe_{0.2}$.

In a CPP operation mode, a tunnel magnetoresistive (TMR) head is another candidate for realizing high sensitivity. In this design, the non-magnetic conductive layer between the pinned layer and free layer in the GMR stack is replaced by an insulating layer such as $AlO_x$. When the magnetoresistive element is a tunneling magnetic junction (TMJ), the tunneling (insulating) layer may be thinned to give a very low RA (<5 ohms-$\mu m^2$).

A CPP-GMR head is generally preferred over a TMR head design for ultra-high density recording because the former has lower impedance. However, the resistance (RA) in a conventional single spin valve is too small (<100 mohm-$\mu m^2$) and the MR ratio of a CPP head may be very low (<5%). Additionally, the output voltage which is related to the resistance change is unacceptably low for many CPP-GMR configurations. One way to increase the resistance change is to optimize the materials and structure of the CPP-GMR head.

Desirable properties for the free layer in a magnetoresistive element include low coercivity (magnetic softness) of <10 Oe and a low magnetostriction ($\lambda_s$) on the order of 1×E-8 to about 5×10E-6 to reduce stress induced anisotropy. A trend in the industry is to employ high spin polarization materials such as CoFe in which the atomic % of Fe is >20%, or NiFe in which the atomic % of Fe is >50%, or [(CoFe)$_{0.8}B_{0.2}$] with ≧25 atomic % Fe in the CoFe composition in order to produce a higher MR ratio. However, higher spin polarization in a ferromagnetic layer is normally associated with a high saturation magnetization (Ms) that leads to unacceptably high ($\lambda_S$) and Hc values. A composite free layer with a $Co_{90}Fe_{10}$/$Ni_{82.5}Fe_{17.5}$ configuration is commonly used in CPP-GMR heads due to its small Hc (~5 Oe) and low $\lambda_S$ of ~2×10E-6 but its dR/R ratio is less than 10% and is not large enough for advanced applications. Therefore, an improved magnetoresistive element is needed that has a high MR (dR/R) ratio of at least 10%, low coercivity, and a low $\lambda_s$ value less than about 5×10E-6.

U.S. Pat. No. 6,888,707 discloses an improved free layer comprised of a very thin CoFe/NiFe composite layer. The Fe content in the CoFe layer is about 10 atomic % and the Fe content in the NiFe layer is about 19% which provides low Hc and λs values. However, the dR/R ratio is not large enough for ultra high density recording purposes.

In U.S. Pat. Nos. 6,519,124 and 6,529,353, a NiFe/CoFe free layer is mentioned but the atomic % of Fe in each layer is not specified. Therefore, the patents do not teach how to resolve the high λs that would result from a high spin polarization CoFe component in the free layer.

U.S. Patent Application Publications 2004/0047190 and 2003/0197505 describe a Ni rich NiCoFe free layer wherein the Ni content is 60 to 90 atomic %. This layer is not used in combination with a CoFe lower layer and is designed as a "soft" magnetic layer.

In U.S. Patent Application Publication 2004/0091743, a composite free layer comprised of an upper NiFe(13.5%) layer and a lower CoFe(16%) layer is disclosed. The free layer is optimized for a slightly negative magnetostriction and does not take into account dR/R which is expected to be low because of the low Fe atomic %.

SUMMARY OF THE INVENTION

One objective of the present invention is to provide a higher MR ratio of at least 10% in a CPP-GMR spin valve structure while maintaining a low coercivity (<5 Oe) and a low $\lambda_s$ of less than about 5×10E-6.

A further objective of the present invention is to provide a method of forming the improved CPP-GMR spin valve head in accordance with the first objective.

These objectives are achieved in one embodiment in which a substrate is provided that may be a first magnetic shield (S1) in a magnetic read head. A sequence of layers is then deposited on the substrate to form a sensor stack with a CPP-GMR configuration that is preferably a bottom spin valve type. In the exemplary embodiment, a seed layer, AFM layer, pinned layer, spacer, free layer, and cap layer are sequentially formed on the substrate. The pinned layer may have a SyAP (AP2/coupling/AP1) configuration in which the AP1 layer is made of a laminated film of CoFe and Cu layers and the coupling layer is a Ru layer. A copper spacer on the AP1 layer may be advantageously comprised of a middle CCP layer made of oxidized AlCu. A key feature is that the free layer is a composite layer comprised of a higher content (v≧20 atomic %) $Fe_vCo_{(100-v)}$ layer where v is from 20 to 70 atomic % and a Ni rich (w≧85 atomic %) $Ni_wFe_{(100-w)}$ layer. A higher MR ratio is attributed to the higher Fe content in the FeCo layer while Hc and $\lambda_S$ are minimized by the Ni rich NiFe layer.

The layers are sputter deposited using Ar gas in a sputtering system that is preferably equipped with an ultra-high vacuum. Oxide formation and segregated metal path definition in the AlCu CCP layer are achieved by following RF-PIT and RF-IAO processes that can be performed in a separate chamber in the sputter system. After the cap layer is deposited, the CPP GMR stack is patterned by a conventional method to form a CPP GMR sensor having a top surface with sidewalls. A well known fabrication sequence is then followed that includes forming an insulating layer adjacent to both sidewalls and a second magnetic shield (S2) on the cap layer.

DETAILED DESCRIPTION OF THE INVENTION

The present invention is a CPP-GMR spin valve structure for use as a sensor in a read head of a magnetic recording device and a method for making the same. The read head may be part of a merged read/write head. The spin valve structure is especially suited for an ultra-high magnetic recording device wherein the recording density is greater than about 100 Gbits/in$^2$. The drawings are provided by way of example and are not intended to limit the scope of the invention. Although a bottom spin valve structure is shown in the exemplary embodiments, those skilled in the art will appreciate that the novel composite free layer of the present invention can also be incorporated in a top spin valve or in multilayer spin valves. Moreover, the invention encompasses TMR sensors or other magnetic devices that are based on a magnetoresistance effect and include a ferromagnetic free layer.

Figure 1:
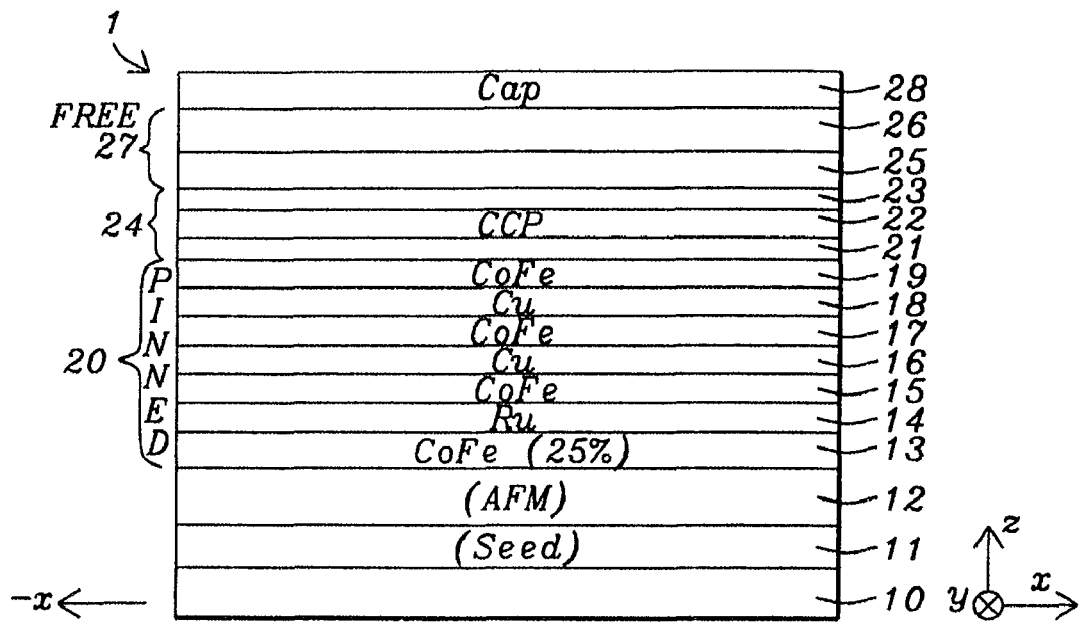
FIG. 1 is a cross-sectional view showing a CPP-GMR spin valve structure according to one embodiment of the present invention.

A first embodiment is set forth in FIG. 1 in which a GMR-CPP or TMR sensor comprised of a bottom spin valve structure is illustrated. The view in FIG. 1 is from a cross-section along an (air bearing surface) ABS plane in the read head. The inventors have unexpectedly found that the Fe content in a FeCo layer of a FeCo/NiFe composite free layer in a CPP GMR or TMR spin valve structure may be increased substantially to ≧20 atomic % without resulting in unacceptably high magnetostriction by increasing the Ni content in the NiFe layer to ≧85 atomic %.

A novel spin valve structure 1 will be described first and then a method of forming the stack of layers in the spin valve structure will be provided. Referring to FIG. 1, a substrate 10 is shown that is typically a first magnetic shield (S1) in a read head. For example, the substrate 10 may be comprised of a 2 micron thick layer of an electroplated permalloy. There is a seed layer 11 that may be comprised of a lower Ta layer (not shown) having a thickness from 10 to 60 Angstroms and preferably about 50 Angstroms thick, and an upper Ru layer having a thickness about 5 to 40 Angstroms thick and preferably 20 Angstroms thick formed on the substrate 10. The seed layer 11 promotes a smooth and uniform crystal structure in the overlying layers that enhances the MR ratio in the spin valve structure 1.

An AFM layer 12 is formed on the seed layer 11 and is preferably comprised of IrMn having a composition of about 18 to 22 atomic % Ir and a thickness of about 50 to 75 Angstroms. Alternatively, the AFM layer 12 may be made of MnPt having a composition between about 55 to 65 atomic % manganese and with a thickness of about 125 to 175 Angstroms. Those skilled in the art will appreciate that other materials such as NiMn, OsMn, RuMn, RhMn, PdMn, RuRhMn, or PtPdMn may also be employed as the AFM layer 12 which is used to pin the magnetization direction in an overlying ferromagnetic (pinned) layer 20.

In one embodiment, a synthetic anti-parallel (SyAP) pinned layer 20 is formed on the AFM layer 12 and is preferably comprised of an AP2/Ru/AP1 configuration. The AP2 layer 13 is preferably comprised of CoFe with a composition of about 75 to 90 atomic % cobalt and a thickness of about 20 to 50 Angstroms. The magnetic moment of the AP2 layer 13 is pinned in a direction anti-parallel to the magnetic moment of the AP1 layer. For example, the AP2 layer may have a magnetic moment oriented along the "+x" direction while the AP1 layer has a magnetic moment in the "−x" direction. The AP2 layer 13 is generally slightly thinner than the AP1 layer to produce a small net magnetic moment for the pinned layer 20. Exchange coupling between the AP2 layer 13 and the AP1 layer is facilitated by a coupling layer 14 that is preferably comprised of Ru with a thickness of about 7.5 Angstroms. Optionally, Rh or Ir may be employed as the coupling layer 14.

Preferably, the AP1 layer is a composite with a [CoFe/Cu]$_n$/CoFe configuration where n=2 or 3. In the exemplary embodiment, n=2 and the AP1 layer is comprised of CoFe layer 15, Cu layer 16, CoFe layer 17, Cu layer 18, and CoFe layer 19 that are formed sequentially on the coupling layer 14. The Cu layers 16, 18 are from 0.5 to 4 Angstroms thick and preferably 2 Angstroms thick while the CoFe layers 15, 17, 19 each have a CoFe composition with a Fe content of about 70 atomic % and a thickness between about 7 and 15 Angstroms, and preferably 12 Angstroms. The use of a laminated AP1 layer to improve CPP-GMR properties was discussed previously. Note that each of the CoFe layers 15, 17, 19 has a magnetic moment in the "−x" direction when the AP1 layer has a magnetic moment along the "−x" axis.

In a preferred embodiment, a non-magnetic spacer 24 is formed on the SyAP pinned layer 20. When the non-magnetic spacer 24 is made of Cu as in a CPP-GMR sensor, an oxygen surfactant layer (not shown) may be formed on the copper layer according to a method described in Headway patent application HT03-009 which is herein incorporated by reference in its entirety. The oxygen surfactant layer is less than about 1 atomic layer in thickness and is used to improve lattice matching between the copper layer and an overlying magnetic layer which in this case is the free layer 27. In other words, the oxygen surfactant layer relieves stress in the spin valve structure 1 and is also used to grow a smooth overlying magnetic layer. Alternatively, for a TMR sensor, the non-magnetic spacer 24 is referred to as a tunnel barrier layer and is comprised of a dielectric material such as AlOx.

In the exemplary embodiment, the non-magnetic spacer 24 is made of Cu with a thickness of about 20 to 50 Angstroms and is comprised of a confining current path (CCP) layer 22 formed between a lower copper layer 21 and an upper copper layer 23. As mentioned previously, a CCP layer may be employed in a CPP-GMR spin valve structure to improve performance. In one aspect, the lower Cu layer 21 is about 2 to 8 Angstroms thick and preferably 5.2 Angstroms thick, and the upper Cu layer 23 has a thickness between 2 and 6 Angstroms and is preferably 3 Angstroms thick. The CCP layer 22 may be made of AlCu that has been partially oxidized by a process described in a later section. The CCP layer 22 has a thickness from 6 to 10 Angstroms and is preferably made from an AlCu layer having a thickness of about 8.5 Angstroms and an Al content of about 90 atomic %.

A key feature of the present invention is the free layer 27 formed on the non-magnetic spacer 24. The free layer 27 is a composite having a lower CoFe layer 25 about 5 to 30 Angstroms thick and an upper NiFe layer 26 with a thickness of from 10 to 60 Angstroms. In particular, the lower CoFe layer 25 has a composition represented by $Fe_vCo_{(100-v)}$ wherein v ranges from about 20 to 70 atomic % and the upper NiFe layer 26 has a composition represented by $Ni_wFe_{(100-w)}$ wherein w ranges from 85 to 100 atomic %. In the prior art, the Fe content in a CoFe free layer has been kept below 20 atomic % because of a concern about unacceptably high $\lambda_S$ and Hc values associated with a Fe content of ≧20 atomic %, and especially with a Fe content above 35 atomic %. The NiFe component of prior art free layers has a Ni content of <85 atomic % in order to optimize the Fe content since it is well known that a higher Fe concentration in a free layer improves the MR ratio of a spin valve. The inventors have found that the major contribution towards a higher MR ratio comes from increasing the Fe content to ≧20 atomic % in the lower FeCo layer 25. By raising the Ni content to ≧85 atomic % in the NiFe layer 26 which is magnetically coupled to the lower FeCo layer 25, the $\lambda_S$ and Hc values for the free layer 27 are maintained within acceptable limits without significantly affecting the MR ratio gain from the FeCo component.

In a preferred embodiment, the FeCo layer 25 has a $Fe_{25}Co_{75}$ composition and a thickness of about 20 Angstroms while the NiFe layer 26 has a $Ni_{90}Fe_{10}$ composition and a thickness of about 28 Angstroms. The aforementioned $Fe_{25}Co_{75}$ and $Ni_{90}Fe_{10}$ layers are advantageously selected since the magnetic moment of $Ni_{90}Fe_{10}$ is very small and its magnetostriction is negative while the magnetic moment of $Fe_{25}Co_{75}$ is only slightly larger than that of $Fe_{10}Co_{90}$ and its magnetostriction is slightly positive. As a result, a composite free layer 27 comprised of $Fe_{25}Co_{75}/Ni_{90}Fe_{10}$ will allow the maximum contribution from the bulk scattering of the $Fe_{25}Co_{75}$ layer while maintaining free layer softness and small magnetostriction. Thus, the overall performance of the spin valve structure 1 has been enhanced relative to a similar spin valve configuration with a standard $Fe_{10}Co_{90}/Ni_{82.5}Fe_{17.5}$ free layer because of a larger MR ratio while maintaining acceptable Hc and $\lambda_S$ values.

The magnetic moment of the free layer 27 is preferably aligned along the y-axis in a quiescent state and can rotate to a magnetic direction along the x-axis under an appropriately sized applied magnetic field such as when the spin valve structure 1 is moved along the ABS plane over a magnetic disk in the z-direction.

The top layer in the spin valve stack is a cap layer 28 that in one embodiment has a Cu/Ru/Ta/Ru configuration in which the Cu layer has a thickness of 10 to 40 Angstroms, the lower Ru layer has a thickness of 10 to 30 Angstroms, the Ta layer is 40 to 80 Angstroms thick, and the upper Ru layer is 10 to 30 Angstroms thick. Optionally, other cap layer materials used in the art may be employed as the cap layer 28.

Table 1 lists the properties of a CPP-GMR spin valve (wafer #2) according to the present invention compared with a CPP-GMR spin valve (wafer #1) previously made by the inventors. The spin valve structures differ only in the composition of the free layer. Note that the numbers (excluding subscripts) refer to thickness in Angstroms for the seed layer (Ta50/Ru20), AFM layer (IrMn70), SyAP pinned layer [$Fe_{25}Co_{75}$46/Ru7.5/($Fe_{70}Co_{30}$12/Cu2)$_2$/$Fe_{70}Co_{30}$12], copper spacer with CCP layer (Cu5.2/AlCu8.5/RF PIT/RFIAO/Cu3), and cap layer (Cu30/Ru10/Ta60/Ru10). RF-PIT and RF-IAO indicate processes used to treat the AlCu layer to form a CCP layer within the copper spacer. The RF PIT process in Table 1 involves etching the AlCu layer with a RF power of 20 Watts and an Ar flow rate of 50 standard cubic centimeters per second (sccm) for 40 seconds. The RE-IAO process comprises a RF power of 27 Watts, an Ar flow rate of 50 sccm and an $O_2$ flow rate of 0.8 sccm for a period of 30 seconds. The free layer in wafer #1 has a 10 Angstrom thick lower $Fe_{25}Co_{75}$ layer and a 35 Angstrom thick upper $Ni_{82.5}Fe_{17.5}$ layer while the free layer in wafer #2 has a 20 Angstrom thick lower $Fe_{25}Co_{75}$ layer and a 28 Angstrom thick upper $Ni_{90}Fe_{10}$ layer.

The advantages of the present invention are summarized by the results in Table 1. Wafer #2 shows an improvement over wafer #1 in that dR/R has increased from 8.6% to 10% (a 16% relative increase) and magnetostriction has decreased to 7.0× 10 E-8 while RA and Hc values are maintained at an acceptable level. It should be understood that if a standard $Co_{90}Fe_{10}$ layer is employed rather than the $Co_{75}Fe_{25}$ layer in the free layer of wafer #1, the dR/R would be less than 8.6%. In other words, both a higher Fe content in the lower FeCo layer and a higher Ni content in the NiFe layer of the free layer contribute to the combination of high dR/R, low λs, and low Hc which has not been achieved previously.

TABLE 1

CCP-GMR properties with various free layer configurations

| Wafer ID | Spin Valve Configuration | RA | dR/R | Hc (Oe) | λs |
|---|---|---|---|---|---|
| #1 | Ta50Ru20/IrMn70/ Fe$_{25}$Co$_{75}$46/Ru7.5/ [Fe$_{70}$Co$_{30}$12/Cu2]$_2$Fe$_{70}$Co$_{30}$12/ Cu5.2/AlCu8.5/RF PIT/RFIAO/ Cu3/Co$_{75}$Fe$_{25}$10/Ni$_{82.5}$Fe$_{17.5}$35/ Cu30/Ru10/Ta60/Ru10 | 0.25 | 8.6% | 4.6 | 2.3E−06 |
| #2 | Ta50Ru20/IrMn70/ Fe$_{25}$Co$_{75}$46/Ru7.5/ [Fe$_{70}$Co$_{30}$12/Cu2]$_2$Fe$_{70}$Co$_{30}$12/ Cu5.2/AlCu8.5/RF PIT/RFIAO/ Cu3/Co$_{75}$Fe$_{25}$20/Ni$_{90}$Fe$_{10}$28/ Cu30/Ru10/Ta60/Ru10 | 0.26 | 10.0% | 4.9 | 7.0E−08 |

Figure 2:
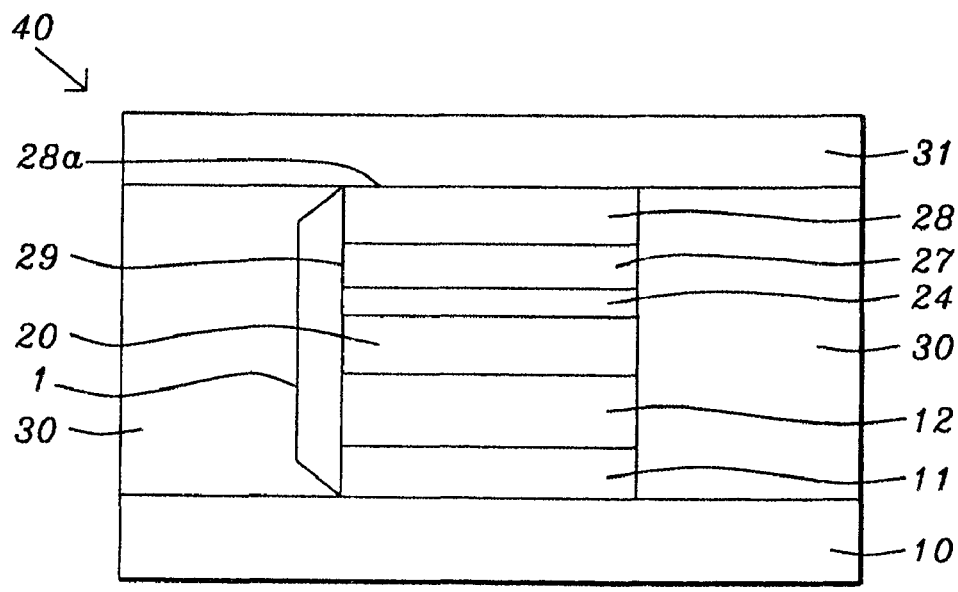
FIG. 2 is a cross-sectional view of a CPP-GMR read head showing the spin valve structure of the present invention formed between a first shield and a second shield.

Referring to FIG. 2, a method of fabricating a magnetic read head 40 that includes the spin valve structure 1 from FIG. 1 will now be described. A substrate 10 is provided as mentioned previously and may be a first magnetic shield (S1) formed by a conventional method in the read head 40. The spin valve stack described previously is laid down by a process in which the seed layer 11, AFM layer 12, pinned layer 20, non-magnetic spacer 24, free layer 27, and cap layer 28 are sequentially formed on the substrate 10. A DC magnetron sputter system such as one available from Anelva may be employed that is capable of a base pressure of at least $1\times10^{-8}$ torr and preferably less than $5\times10^{-9}$ torr which is about 1 order of magnitude lower than a CVC system used in the art. A lower base pressure allows films to be sputter deposited with higher uniformity and reproducibility. It should be understood that a sputter chamber may have multiple targets which are low pressure discharge cathodes. The sputter gas is preferably Ar. All of the sputter deposited films may be laid down in the same sputter chamber or in different sputter chambers within the same mainframe.

In an embodiment where the non-magnetic spacer 24 is comprised of a lower Cu layer 21, a CCP layer 22, and an upper Cu layer 23 (FIG. 1), the CCP layer may be formed by depositing an AlCu layer about 6 to 10 Angstroms thick on the lower Cu layer followed in succession by a RF (plasma or ion treatment) PIT process and a RF-IAO process to form a partially oxidized AlCu layer. The RF PIT and RE-IAO (plasma oxidation or ion assisted oxidation) processes are preferably performed in a separate chamber within the sputter system and have been previously described in Headway application HT03-043 which is herein incorporated by reference in its entirety. The RF PIT process preferably involves a low power plasma etch to remove about 1 to 3 Angstroms of the AlCu layer and may comprise the following conditions: an Ar flow rate of about 50 sccm and a RF power level of 17 to 20 Watts for about 20 to 60 seconds. During the RF-IAO process, the AlCu layer is subjected to plasma oxidation which converts the AlCu layer into CCP layer 22 that is essentially a porous aluminum oxide layer whose pores are filled with Cu. The RF-IAO process typically comprises the following conditions: an Ar flow rate of about 30-50 sccm, an O$_2$ flow rate of 0.3 to 1 sccm, and a RF power level of 20 to 30 W for about 15 to 45 seconds. Subsequently, the upper Cu layer 23 is sputter deposited on the CCP layer 22 followed by the sequential deposition of the free layer 27 and cap layer 28 on the upper Cu layer.

Optionally, for a read head 40 that is based on TMR spin valve structure 1, the non-magnetic spacer (tunnel barrier) 24 is prepared by first depositing an Al layer or the like about 5 to 6 Angstroms thick on the pinned layer 20 and then oxidizing with a natural oxidation or radical oxidation to form an oxide layer such as AlOx which has a stoichiometry close to that of Al$_2$O$_3$.

After all of the layers in the spin valve stack are laid down on the substrate 10, the spin valve stack is patterned and etched by a well known process that employs a photoresist layer (not shown) and an ion beam etch (IBE) method, for example. Following the etch step, a spin valve structure having a top surface 28a and sidewalls 29 is defined. An insulating layer 30 is typically deposited to a depth that covers the sidewalls 29. There may also be a biasing layer (not shown) that is formed within the insulating layer 30 proximate to each side of the spin valve structure to provide longitudinal biasing to the free layer as appreciated by those skilled in the art. Thereafter, the photoresist layer is removed by a lift-off process and the insulating layer 30 may be smoothed by a planarization technique such as a chemical mechanical polish (CMP) method to become coplanar with the top surface 28a.

The spin valve structure 1 may be annealed in a magnetic field of about 8000 and 12000 oersted at a temperature between about 250° C. and 300° C. for a period of 2 to 5 hours. The remainder of the read head 40 may then be fabricated by a conventional process. For example, a second magnetic shield 31 may be formed on the top surface 28a and over the insulating layer 30. Those skilled in the art will appreciate that in a CPP spin valve structure, the second magnetic shield layer (S2) is also used as the top conductor lead layer.

While this invention has been particularly shown and described with reference to, the preferred embodiment thereof, it will be understood by those skilled in the art that various changes in form and details may be made without departing from the spirit and scope of this invention.

We claim:

1. A spin valve structure for use as a sensor in a magnetic read head, comprising:
   (a) a pinned layer;
   (b) a free layer that is a composite film comprised of a lower Fe$_v$Co$_{(100-v)}$ layer in which v is from about 20 to 70 atomic %, and an upper Ni$_w$Fe$_{(100-w)}$ layer wherein w is from 85 to 100 atomic %, the spin valve structure has sidewalls that are substantially planar along the entire free layer; and
   (c) a non-magnetic spacer between the pinned layer and free layer, the sidewalls along each side of the free layer are adjoined by an insulation layer.

2. The spin valve structure of claim 1 wherein the spin valve structure is formed on a first magnetic shield in a CPP-GMR magnetic read head.

3. The spin valve structure of claim 2 wherein the pinned layer is formed on a stack comprised of a lower seed layer on the first magnetic shield and an upper AFM layer, and a cap layer is formed on the free layer to give a bottom spin valve configuration.

4. The spin valve structure of claim 1 wherein the pinned layer is pinned by an adjacent AFM layer and is comprised of an AP2/coupling/AP1 configuration in which the AP2 layer is a CoFe layer having an Fe content of about 25 atomic %, the coupling layer is Ru, and the AP1 layer is a lamination of CoFe layers having an Fe content of about 70 atomic % and Cu layers represented by the composition [CoFe/Cu]$_n$/CoFe in which n=2 or 3.

5. The spin valve structure of claim 1 wherein the lower Fe$_v$Co$_{(100-v)}$ layer has a thickness from about 5 to 30 Angstroms and the upper $Ni_w Fe_{(100-w)}$ layer has a thickness between about 10 and 60 Angstroms.

6. The spin valve structure of claim 5 wherein v is about 20 atomic % and the thickness of the lower $Fe_v Co_{(100-v)}$ layer is about 20 Angstroms, and w is about 90 atomic % and the thickness of the upper $Ni_w Fe_{(100-w)}$ layer is about 28 Angstroms.

7. The spin valve structure of claim 1 wherein the non-magnetic spacer is comprised of copper and has a confining current path (CCP) layer formed therein between a lower Cu layer and an upper copper layer, said CCP layer is made of porous aluminum oxide having pores filled with copper.

8. The spin valve structure of claim 1 wherein the non-magnetic spacer is a non-magnetic conductive layer and the sensor is based on a GMR effect.

9. The spin valve structure of claim 1 wherein the non-magnetic spacer is a dielectric layer and the sensor is based on a tunnel magnetoresistance (TMR) effect.

10. The spin valve structure of claim 1 wherein the pinned layer, free layer, and non-magnetic pacer are part of a bottom spin valve, top spin valve, or multilayer spin valve.

11. A CPP-GMR magnetic read head, comprising:
(a) a first magnetic shield;
(b) a spin valve structure having a top surface and sidewalls formed on the first magnetic shield wherein said spin valve structure is comprised of a pinned layer, a non-magnetic spacer, and a free layer that is a composite film comprised of a lower $Fe_v Co_{(100-v)}$ layer in which v is from about 20 to 70 atomic %, and an upper $Ni_w Fe_{(100-w)}$ layer wherein w is from 85 to 100 atomic %, the sidewalls are substantially planar along the entire free layer and are adjoined on each side of the free layer by an insulation layer; and
(c) a second magnetic shield formed on the top surface of the spin valve structure.

12. The CPP-GMR magnetic read head of claim 11 wherein the pinned layer is formed on a stack comprised of a lower seed layer on the first magnetic shield and an upper AFM layer, and a cap layer is formed as the uppermost layer in the spin valve structure.

13. The CPP-GMR magnetic read head of claim 12 wherein the seed layer has a Ta/Ru configuration, the AFM layer is comprised of IrMn, and the cap layer has a Cu/Ru/Ta/Ru configuration.

14. The CPP-GMR magnetic read head of claim 11 wherein the pinned layer is comprised of an AP2/coupling/AP1 configuration in which the AP2 layer is a CoFe layer having an Fe content of about 25 atomic %, the coupling layer is Ru, Rh, or Ir, and the AP1 layer is a lamination of CoFe layers and Cu layers represented by the composition [CoFe/Cu]$_n$/CoFe in which n=2 or 3.

15. The CPP-GMR magnetic read head of claim 11 wherein the lower $Fe_v Co_{(100-v)}$ layer has a thickness from about 5 to 30 Angstroms and the upper $Ni_w Fe_{(100-w)}$ layer has a thickness between about 10 and 60 Angstroms.

16. The CPP-GMR magnetic read head of claim 15 wherein v is about 20 atomic % and the thickness of the lower $Fe_v Co_{(100-v)}$ layer is about 20 Angstroms, and w is about 90 atomic % and the thickness of the upper $Ni_w Fe_{(100-w)}$ layer is about 28 Angstroms.

17. The CPP-GMR magnetic read head of claim 11 wherein the non-magnetic spacer is comprised of copper and has a CCP layer formed therein between a lower Cu layer and an upper copper layer, said CCP layer is made of porous aluminum oxide having pores that are filled with copper.

18. The CPP-GMR magnetic read head of claim 11 further comprised of an insulating layer formed adjacent to said sidewalls and a biasing layer formed within the insulating layer proximate to each sidewall, said biasing layer provides longitudinal biasing to the free layer in said spin valve structure.

19. The CPP-GMR magnetic read head of claim 11 wherein the spin valve structure is a bottom spin valve, top spin valve, or multilayer spin valve.

20. The CPP-GMR magnetic read head of claim 11 wherein v is a controlling factor in optimizing a magnetoresistance (MR) value for the spin valve structure and w is adjusted to maintain a low coercivity and low magnetostriction in the spin valve structure.

* * * * *